US 6,624,452 B2
Sep. 23, 2003

(54) GALLIUM NITRIDE-BASED HFET AND A METHOD FOR FABRICATING A GALLIUM NITRIDE-BASED HFET

(75) Inventors: Edward T. Yu, San Diego, CA (US); Peter M. Asbeck, San Diego, CA (US); Silvanus S. Lau, San Diego, CA (US); Xiaozhong Dang, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/918,306

(22) Filed: Jul. 30, 2001

(65) Prior Publication Data

US 2002/0036287 A1 Mar. 28, 2002

Related U.S. Application Data

(60) Provisional application No. 60/221,430, filed on Jul. 28, 2000.

(51) Int. Cl.$^7$ .................. H01L 31/072; H01L 31/109; H01L 31/0328; H01L 31/0336; H01L 29/20; H01L 31/0304

(52) U.S. Cl. .................. 257/194; 257/192; 257/615

(58) Field of Search .................. 257/192, 194, 257/615

(56) References Cited

U.S. PATENT DOCUMENTS 6,064,082 A * 5/2000 Kawai et al. ............... 257/191
6,100,549 A * 8/2000 Weitzel et al. ............. 257/194
6,328,796 B1 * 12/2001 Kub et al. .................. 141/114

FOREIGN PATENT DOCUMENTS

JP 11-274474 * 8/1999 ......... H01L/29/778

OTHER PUBLICATIONS

A.R. Smith, Determination of wurtzite GaN lattice polarity based on surface reconstruction, Apr. 27, 1998, Applied physics letters, vol. 72, No. 17, pp. 2114–2116.*

G.J. Sullivan, High pwer RF operation of AlGaN/GaN HEMTs grown on insulating silicon carbide substrates, Electronics letters, Apr. 30, 1998, vol. 34, No. 9, pp. 922–924.*

Aktas, O,; Fan, Z.F.; Botchkarev, A.; Mohammad, S.N.; Roth, M.; Jenkins, T.; Kehias, L.; Morkoc, H.; "Microwave performance of AlGaN/GaN inverted MODFET's" IEEE Electron Device Letters, vol. 18, (No. 6), IEEE, Jun. 1997, p. 293–5.

Murphy, M.J.; Foutz, B.E.; Chu, K.; Wu, H.; Yeo, W.; Schaff, W.J.; Ambacher, O.; Eastman, L.F.; Eustis, T.J. Dimitrov, R.; Stutzmann, M.; Riegerd, W., "Normal and inverted AlGaN/GaN based piezoelectric field effect transistors grown by plasma induced molecular beam epitaxy" MRS Internet Journal of Nitride Semiconductor Research, vol. 4S1, Mater. Res. Soc, 1999.

(List continued on next page.)

*Primary Examiner*—Steven Loke
*Assistant Examiner*—Samuel A Gebremariam
(74) *Attorney, Agent, or Firm*—Greer, Burns & Crain, Ltd.

(57) ABSTRACT

A GaN-based HFET includes a set of layers all having a common face polarity, i.e., all being either Ga-face or N-face. One of the layers is a thin barrier layer having a first face with a positive charge and a second face with a negative charge thereby causing a potential change to occur between the two faces. The if potential change causes the barrier layer to prevent electron flow from a channel layer into a buffer layer. The GaN-based HFET may also be fabricated without a top barrier layer to obtain an inverted GaN-based HFET.

23 Claims, 3 Drawing Sheets

OTHER PUBLICATIONS

Gaska, R.; Shur, M.S.; Yang, J.W.; Fjedly, T.A. (Edited by DenBaars, S.; Palmour, J.; Shur, M.; Spencer, M., "Double channel AlGaN/GaN heterostructure field effect transistor". Wide–Bandgap Semiconductors for High Power, High Frequency and High Temperature. Symposium, (Wide–Bandgap Semiconductors for High Power, High Frequency and Frequency and High Temperature. Symposium, (Wide–Bandgap Semiconductors for High Power, High Frequency and High Temperature. Symposium, Wide–Bandgap Semiconductors for High Power, High Frequency and High Temperature. Symposium, San Francisco, CA, USA, Apr. 13–15, 1998.) Warrendalde, PA, USA: Mater. Res. Soc., 1998, p. 9–13.

X.Z. Dang, R.J. Welty, D. Qiao, P.M. Asbekc, S.S. Lau, E.T. Yu, K.S. Boutros, and J.M. Redwing, Frabrication and Characterization of Enhanced Barrier AlGaN/GaN HFETT, Electronics Lett., 35 (7), 602–603 (1999).

Yu, E.T.; Sullivan, G.J.; Asbeck, P.M.; Wang, C.D.; Qiao, D.; Lau, S.S., "Measurement of piezoelectrically induced charge in GaN/AlGaN heterostructure field–effect transistors", Applied Physics Letters, vol. 71, (No. 19), AIP, Nov. 10, 1997. p. 2794–6.

\* cited by examiner

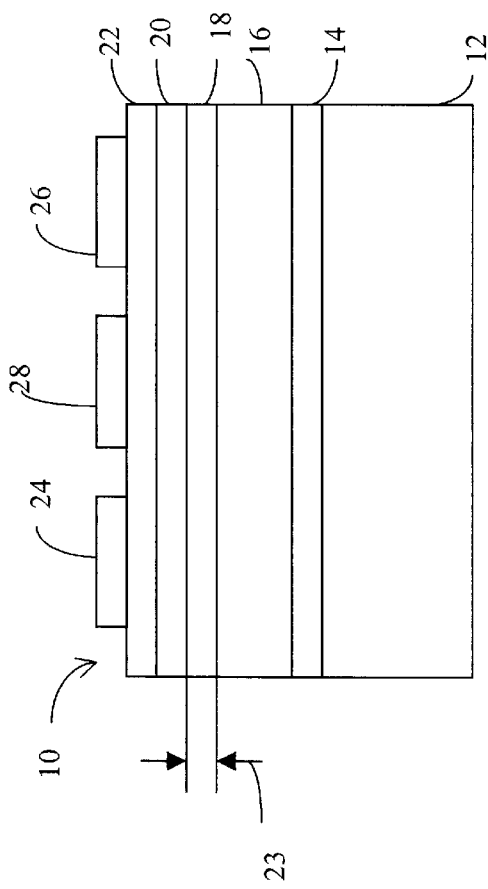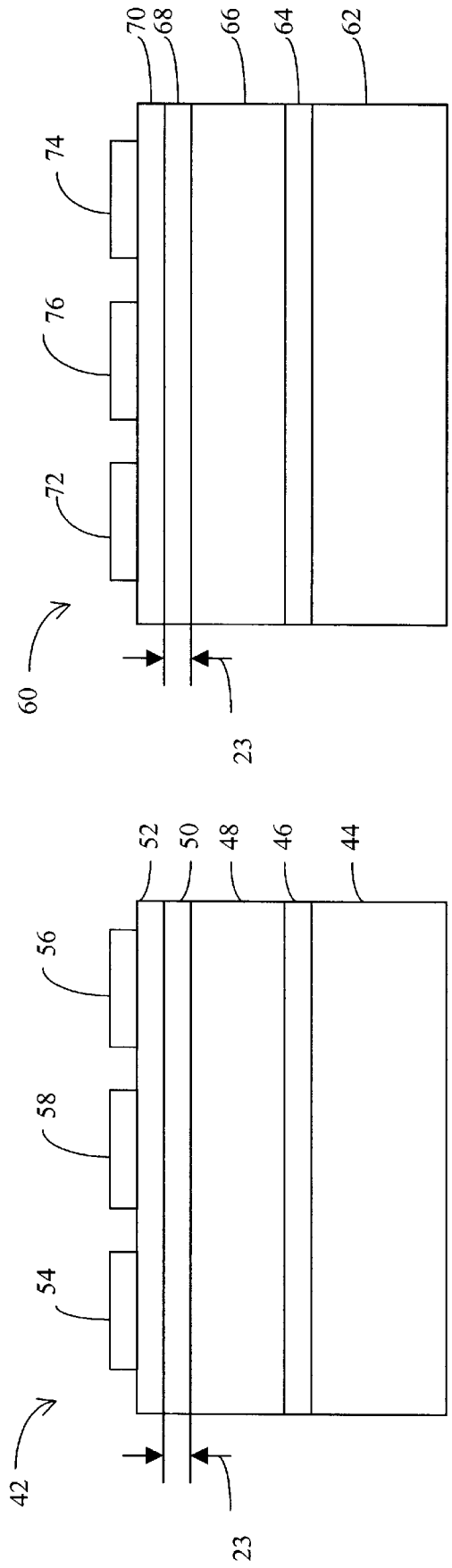

GALLIUM NITRIDE-BASED HFET AND A METHOD FOR FABRICATING A GALLIUM NITRIDE-BASED HFET

RELATED APPLICATIONS AND PRIORITY CLAIMS

This application is related to prior provisional application Ser. No. 60/221,430 filed Jul. 28, 2000. This application claims priority from that prior application under 35 U.S.C. §119. +gi

STATEMENT OF GOVERNMENT INTEREST

This invention was made with United States government assistance through the Office of Naval Research, grant no. N000149810539. The government has certain rights in this invention.

FIELD OF THE INVENTION

The invention is in the gallium nitride semiconductor field.

BACKGROUND OF THE INVENTION

Heterostructure field effect transistors (HFETs) are electronic devices having three terminals including a gate, a drain and a source. An electric potential applied to the gate terminal controls the flow of current from the drain terminal to the source terminal via an electrically conductive channel. The electrically conductive channel is defined by at least one heterointerface between two different semiconductor materials. If at least one of the two semiconductor materials includes GaN or an alloy of GaN with Indium or Aluminum, the device is referred to as a GaN-based HFET.

Often HFETs fabricated with different material systems, such as AlGaAs/GaAs materials, further include a barrier layer disposed between the channel layer and a buffer layer that electrically isolates the channel layer from the buffer layer thereby eliminating a number of non-ideal and generally undesired HFET behaviors. For example, the barrier layer, by preventing the flow of electrons from the channel layer to the buffer layer, reduces the number of electrons that may become trapped in the buffer layer. In addition, the barrier layer suppresses the flow of leakage current, reduces buffer layer related output conductance and improves pinch-off characteristics. It can also improve the high speed characteristics of the HFET, particularly ft and fmax.

Unfortunately, attempts to produce GaN-based HFETs having a conventional barrier layer have been unsuccessful. Specifically, the barrier layer in an HFET is conventionally formed using an alloy containing the same semiconductor material present in the channel and further containing aluminum. Thus, GaN-based HFETs having a conventional barrier layer would include a layer of AlGaN disposed between the channel and the buffer layers. However, using AlGaN to form a barrier layer in a GaN-based HFET leads to interface roughness, and frequently contamination with impurities such as oxygen. Further, AlGaN when used as a barrier layer, contains polarization charges caused by electrical properties that are inherent to AlGaN (spontaneous polarization) and further caused by electrical properties resulting from strain associated with forming the AlGaN layer (piezoelectric polarization). These polarization charges result in the formation of electrical fields that cause the semiconductor device to exhibit undesirable, non-HFET behavior characteristics. As a result, a GaN-based HFET having a conventional, aluminum doped barrier layer is not feasible.

HFETs formed with GaN materials typically include a barrier layer of AlGaN that is disposed on the channel layer to induce a high concentration of electrons in the channel and thereby enhance the electrically conductive properties of the channel. Unfortunately, the AlGaN barrier disposed on top of the channel makes ohmic contact with the channel difficult. In addition, the polarized nature of the AlGaN layer disposed on top of the channel results in the formation of surface charges that adversely affect the operation of the GaN-based HFET. Further, HFETs formed with an AlGaN layer on top of the channel layer suffer from trapping effects wherein electrons migrate from the channel to the AlGaN layer and become trapped.

Thus, there is a need for a GaN-based HFET structure that addresses some or all of the aforementioned difficulties.

SUMMARY OF THE INVENTION

A GaN-based HFET of the invention includes a barrier layer that is disposed between a buffer layer and a channel layer. Polarization charges associated with the barrier layer create a potential barrier that prevents electrons from flowing out of the channel and into the buffer.

In another embodiment, an inverted GaN-based HFET includes a barrier layer disposed between the buffer layer and the channel layer but does not require a barrier layer disposed on top of the channel. Polarization charges associated with the barrier layer create a potential barrier that prevents electrons from flowing out of the channel layer and into the buffer layer. The barrier layer and the buffer layer may be doped in a manner that induces a desired level of electron concentration in the channel. Alternatively, the channel layer may be doped in manner that induces a desired level of electron concentration in the channel layer.

BRIEF DESCRIPTION OF THE DRAWINGS

Other features and advantages of the invention will be apparent to those skilled in the art with reference to the detailed description and the drawings, of which:

FIG. 1 illustrates a GaN-based HFET in accordance with the invention;

FIG. 3 illustrates a GaN-based inverted HFET in accordance with a further embodiment of the invention;

FIG. 4 illustrates a GaN-based inverted HFET in accordance with a still further embodiment of the invention; and, FIG. 5 illustrates a method for fabricating the GaN-based HFET of FIGS. 3 and 4.

DETAILED DESCRIPTION OF THE PREFERRED EMBODIMENTS

Figure 2:
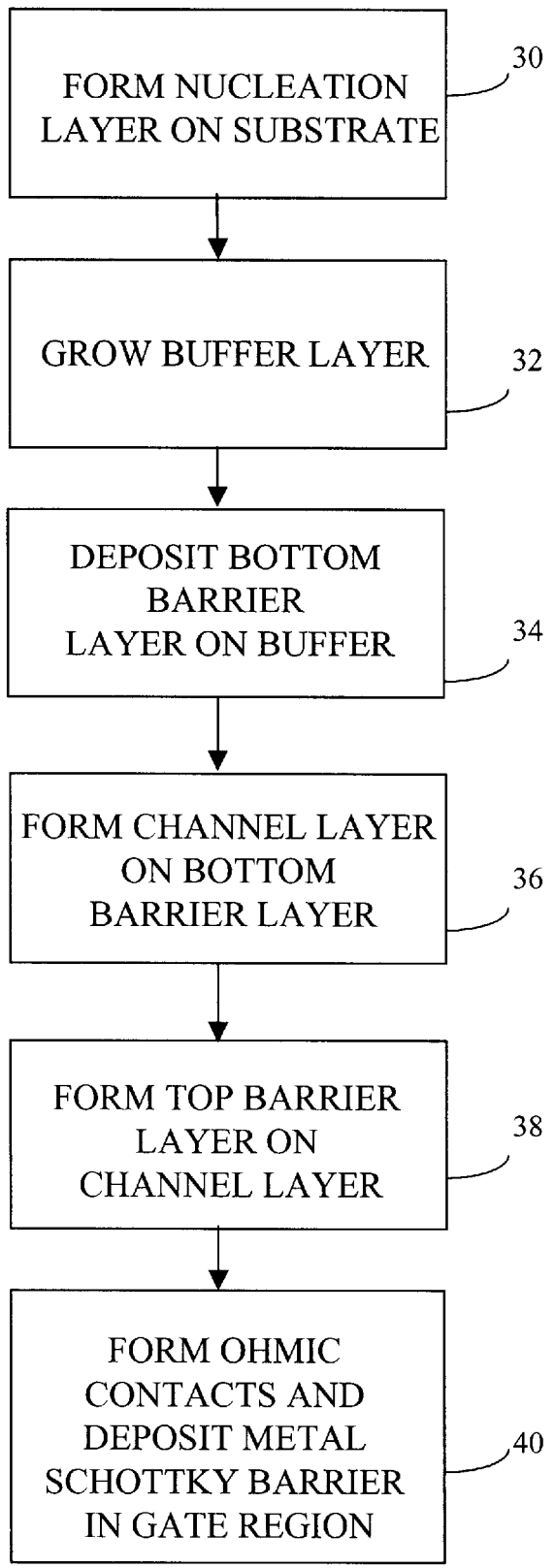
FIG. 2 illustrates a method for fabricating the GaN-based HFET of FIG. 1.

The GaN-based HFET of the invention includes a barrier layer disposed between a channel layer and a buffer layer. The barrier layer electrically isolates the channel layer from the buffer layer by reducing electron flow from the channel layer to the buffer layer. The GaN based HFETs of the invention may further be designed to include a barrier layer disposed on top of the channel layer.

A GaN based HFET 10, shown in FIG. 1, in accordance with the invention includes a structure having a set of layers including a substrate layer 12, a nucleation layer 14, a buffer layer 16, a bottom barrier layer 18, a channel layer 20 and 11 a top barrier layer 22. The substrate layer 12 which may be comprised of sapphire, silicon carbide (SiC) or any other suitable material is disposed on the bottom of the HFET 10 and provides a support on which the remaining layers are positioned. The nucleation layer 14, comprised of either Aluminum Nitride (AlN) or Gallium Nitride (GaN) or an AlGaN alloy, may be disposed between the substrate layer 12 and the buffer layer 16 to improve the crystal structure of the GaN layers disposed above the nucleation layer 14. The buffer layer 16 provides a structural backbone on which the channel layer 20 may be formed. The bottom barrier layer 18 provides an electron barrier between the channel layer 20 and the buffer layer 16. Specifically, polarization charges formed at the interface between the channel layer 20 and the bottom barrier layer 18, and polarization charges of the opposite sign formed at the interface between the bottom barrier layer 18 and the buffer layer 16, cause an electrical potential difference to form across the bottom barrier layer 18 which allows the bottom barrier layer 18 to act as an electron barrier and as a modulation doping layer. As will be appreciated by one having ordinary skill in the art, a modulation doping layer is a layer that may be doped with donors causing electrons to accumulate in the channel layer.

A top barrier layer 22 disposed on the channel layer 20 causes a large sheet having a positive charge to form at the interface between the channel layer 20 and the top barrier layer 22. The large positive sheet enhances the electrical conductivity of the channel layer 20. In addition, two ohmic contacts 24, 26 to the channel layer 20 are formed through the top barrier layer 22 in a source region and a drain region, respectively, and a metal Schottky barrier region 28 is deposited in the gate region between the source region and the drain region.

In a first embodiment, the buffer layer 16 may comprise undoped GaN and the bottom barrier layer 18 may comprise Indium Gallium Nitride (InGaN). Further, the channel layer 20 comprises GaN that may but, need not, be doped with silicon (Si). Lastly, the top barrier layer 22 may comprise AlGaN and may also but, need not, be doped with Si. In addition, all of the nitride layers have Ga-face polarity wherein the crystal structure of the layers are grown so that the top face of each layer, i.e., the face nearest to the top barrier layer, is formed of Ga atoms and the bottom face of each layer, i.e., the face nearest to the substrate, is formed of N atoms. Further, because each layer is formed having Ga-face polarity, the top surface of the bottom barrier layer 18 has a positive charge and the bottom surface of the bottom barrier layer 18 has a negative charge. Moreover, the bottom barrier layer 18 has a thickness 23 less than 500 Angstroms (A) and, as described above, the change in potential across the thin bottom barrier layer 18 causes the bottom barrier layer 18 to act as a potential barrier thereby preventing electrons from flowing out of the channel layer 20 into the buffer layer 16. Thus, the GaN-based HFET of the invention benefits from the inherent polarization charges formed in the nitride layers. Specifically, orienting the layers so that each has a Ga-face polarity and growing a thin bottom barrier layer 18 that experiences a potential change across the barrier layer that acts as an electron barrier, enables the formation of a GaN-based HFET 10 having a bottom barrier layer 18 that benefits from the advantages attendant to having a bottom barrier layer, yet still functions in a manner that is characteristic of conventional HFET operation In a second embodiment, the buffer layer 16 may comprise undoped AlGaN and the bottom barrier layer 18 may comprise, for example, GaN. The channel layer 20 comprises AlGaN that may but, need not, be doped with Si. The top barrier layer 22 may also comprise AlGaN and may further be doped with a suitable dopant, such as Si. In addition, all of the nitride layers have Ga-face polarity and the bottom barrier layer 18 has a thickness 23 less than 500 Angstroms (A). Further, as described above, the change in potential across the thin bottom barrier layer 18 causes the bottom barrier layer 18 to act as a potential barrier thereby preventing electrons from flowing out of the channel layer 20 into the buffer layer 16. The orientation of the GaN-based layers and the electron barrier formed across the thin bottom barrier layer, enables the formation of a GaN-based HFET 10 having a bottom barrier layer 18 that benefits from the advantages attendant to having a bottom barrier layer, yet still functions in a manner that is characteristic of conventional HFET operation.

In a third embodiment, the buffer layer comprises GaN 16, the bottom barrier layer 18 comprises AlGaN, the channel layer comprises 20 GaN and the top barrier layer comprises 22 InGaN. In this embodiment, the nitride layers are formed having N-face polarity such that the top face of each layer is formed of N atoms and the bottom face of each layer is formed of Ga atoms. As a result, the top face of the bottom barrier layer 18, which is less than 500 A thick, has a positive charge and the bottom face of the bottom barrier layer 18 has a negative charge. Further, the thickness and face polarity of the bottom barrier layer causes the bottom barrier layer 18 to function as an electron barrier. In this embodiment, as with the embodiments described above, the orientation of the GaN-based layers and the electron barrier formed across the thin bottom baffler layer 18, enables the formation of a GaN-based HFET 10 having a bottom baffler layer 18 that benefits from the advantages attendant to having a bottom baffler layer 18, yet still functions in a manner that is characteristic of conventional HFET operation.

Referring also to FIG. 2, a method for fabricating the HFET 10 shown in FIG. 1 may begin by forming the nucleation layer 14 on the substrate layer 12 (step 30). Next, the buffer layer 16 is grown on the nucleation layer 14 (step 32). As will be appreciated by one having ordinary skill in the art, a number of methods may be used to grow the buffer layer 16 including, for example, metal organic chemical vapor deposition (MOCVD) or molecular beam epitaxy (MBE) or a combination of more than one method. Next, a thin bottom baffler layer 18 is deposited on the buffer layer 16 (step 34). Subsequently, a channel layer 20 is formed on the bottom baffler layer 18 (step 36). The channel layer 20 may but, need not, be doped with Si. On the channel layer 20, a top baffler layer 22 is formed either with or without Si doping (step 38). As described above, all of the layers, 16, 18, 20, 22 are formed having Ga-face polarity or all of the layers 16, 18, 20, 22 are formed having N-face polarity. Further, the bottom barrier layer 18 is formed having a thickness 23 less than 500A.

After the layer formation, individual HFETs may be isolated by mesa etching or ion implantation. Finally, ohmic contacts 24, 26 to the channel are formed in source and drain regions, respectively, either through the top barrier layer 22 or after etching through the top barrier layer 22 and a metal Schottky barrier 28 is deposited in the gate region between the source and the drain (step 40). If desired, the step of growing the buffer layer 16 (step 32) may further include the step of doping the buffer layer and the step of depositing the bottom barrier layer 18 (34) may be modified to include the step of doping the bottom barrier layer to substantially increase the drain to source current, $I_{DS}$, and the sheet concentration, $n_s$ of the HFET.

As will appreciated by one having ordinary skill in the art, various parameters associated with the layers of the GaN-based HFET 10 will affect the performance characteristics of the HFET 10 including, for example, the thickness of the layers, the amount of silicon dopant added to the layers, and the concentration of Al or In that is present in the layers of the HFET 10. Sample layer parameters for the GaN-based HFET having a bottom barrier layer comprising GaN are provided below in Tables A and B and sample layer parameters for the GaN-based HFET having a bottom barrier layer comprising InGaN are provided below in Table C.

TABLE A

| Name of Layer | Thickness of Layer | Representative Al mol fraction | doped? (y/n) |
|---|---|---|---|
| top barrier | 225A | 24% | n |
| channel | 100A | 8% | n |
| bottom barrier | 75A | 0% | n |
| buffer | 1–2 μm | 8% | n |

TABLE B

| Name of Layer | Thickness of Layer | Representative Al mol fraction | doped? (y/n) |
|---|---|---|---|
| top barrier | 100A | 8% | n |
| channel | 100A | 8% | y-Ndle18cm$^{-3}$ |
| bottom barrier | 100A | 0% | n |
| buffer | 1–2 μm | 8% | n |

TABLE C

| Name of Layer | Thickness of Layer | Representative Al or In mol fraction | doped? (y/n) |
|---|---|---|---|
| top barrier | 250A | 20% (Al) | n |
| channel | 100A | 0% | n |
| bottom barrier | 75A | 8% (In) | n |
| buffer | 1–2 μm | 0% | n |

Further, the surface morphology of a buffer layer 16 formed with AlGaN may be problematic and may possibly reduce the channel mobility. To avoid this, the buffer layer 16 may be formed using GaN that is slowly graded to AlGaN. Unfortunately, a donor-like polarization charge in such a graded AlGaN layer may cause the structure to experience buffer layer leakage. To counter the buffer layer leakage, the buffer may be doped with Beryllium (Be).

Referring now to FIG. 3, according to another embodiment of the invention, an inverted HFET 42 includes a substrate 44 comprising, for example, sapphire, SiC or any other suitable substrate material. A buffer layer 48 comprising GaN is disposed on a nucleation layer 46 comprised of AlN or GaN or an AlGaN alloy. A thin barrier layer 50 comprising InGaN disposed on top of the buffer layer 48 functions as an electron barrier preventing electrons from flowing out of a channel layer 52 comprising GaN that is disposed on the barrier layer 50 into the buffer layer 48. A set of ohmic contacts 54, 56 are formed in a source region and drain region, respectively, and a metal Schottky barrier 58 is deposited in the gate region between the source and drain regions. In this embodiment all of the nitride layers are formed having Ga-face polarity and the thin barrier layer is formed having a thickness less than 500A.

As will be appreciated by one having ordinary skill in the art, an inverted HFET device behaves differently than a conventional, i.e., non-inverted, HFET device due to the absence of a top barrier of material above the channel. This leads to easier formation of ohmic contacts to the channel, and avoids the potential problem of electron trapping in the barrier material. In addition, inverted HFETs formed with GaN-based materials do not experience the formation of large surface charge concentrations in the regions between the gate and drain terminals which may cause anomalous current transients in conventional GaN-based HFETs.

Referring now to FIG. 4, according to another embodiment of the invention, an inverted HFET 60 includes a substrate 62 comprising, for example, sapphire, SiC or any other suitable substrate material. A buffer layer 66 comprising GaN is disposed on the substrate layer 62 with an intervening nucleation layer 64 comprising AlN or GaN or AlGaN disposed therebetween. A thin barrier layer 68 comprising GaN disposed on top of the buffer layer 66 functions as an electron barrier preventing electrons from flowing out of a channel layer 70 comprising AlGaN that is disposed on the barrier layer 68 into the buffer layer 66. A set of ohmic contacts 72, 74 are formed in a source region and drain region, respectively, and a metal Schottky barrier 76 is deposited in a gate region between the source and drain regions. In this embodiment all of the nitride layers are formed having Ga-face polarity and the thin barrier layer is formed having a thickness less than 500A.

According to yet another embodiment, the inverted HFET shown in FIG. 4 may instead be formed having a buffer layer 66 comprised of GaN, a barrier layer 68 comprised of AlGaN and a channel layer 70 comprised of GaN. In addition, the layers 66, 68, 70 are formed having N-face polarity and the thin barrier layer 68 is formed having a thickness less than 500A.

Figure 5:
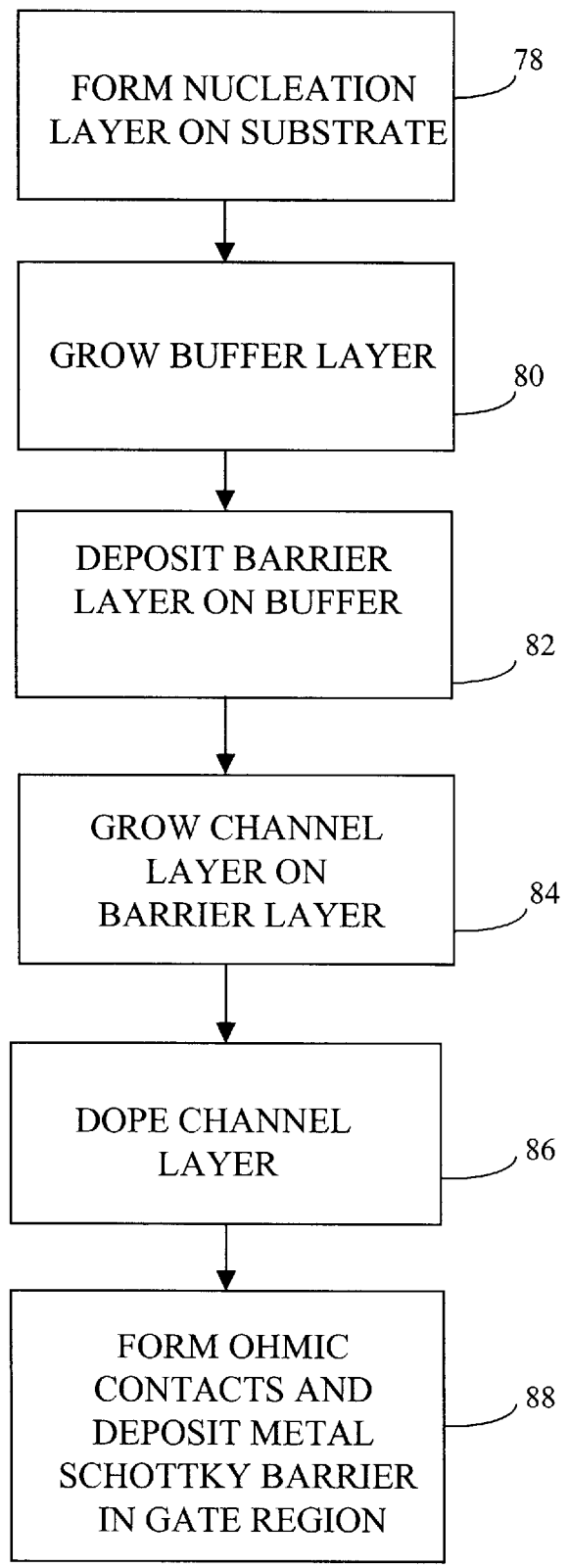

Referring also to FIG. 5, the inverted HFETs 42, 60 shown in FIGS. 3 and 4 may be fabricated according to a method that begins by depositing a nucleation layer 64 of AlN onto a substrate layer 62 comprising, for example, sapphire or SiC (step 78). Next, the buffer layer 66 is grown on the nucleation layer 64 using any desired method such as, for example, MOCVD or MBE (step 80). On top of the buffer layer 66, the barrier layer 68 is deposited (step 82). The channel layer 70 is then grown on top of the barrier layer 68 (step 84). Doping is performed in the channel layer 70 using a silicon (Si) dopant to provide the channel layer 70 with an electron concentration (step 86). Finally, ohmic contacts 72,74 are formed in the source and drain regions, respectively, of the channel layer 70 and a metal Schottky barrier 76 is deposited in the gate region between the source and drain regions (step 88). As described above, all of the layers of the inverted HFET are formed having Ga-face polarity or all of the layers are formed having N-face polarity. Further, the baffler layer is formed having a thickness 23 less than 500A.

In an alternative embodiment, instead of doping the channel layer 70 with Si (step 86), the buffer layer 66 and barrier layer 68 may be doped with Si thereby resulting in the transfer of electrons from the dopants to the low energy regions of the conduction band in the adjacent channel layer 70 and increasing the drain to source current, $I_{DS}$, and $n_s$. As will be appreciated by one having ordinary skill in the art, the phenomenon by which electrons are transferred from the dopants to the low energy regions of the conduction band in the adjacent channel is known as the modulation doping principle.

While various embodiments of the present invention have been shown and described, it should be understood that other modifications, substitutions and alternatives are apparent to one of ordinary skill in the art. For example, one of ordinary skill in the art will understand that other combinations of InN, AlN and GaN may be used to build an HFET/inverted HFET belonging to the InGaAlN alloy family that acts in substantially the same way as the HFETs/inverted HFETs described herein provided that the layers are oriented properly, i.e., all having Ga-face polarity or all having N-face polarity, and further provided that the barrier layer disposed between the buffer layer and channel layer is properly dimensioned to have a thickness less than 500A.

Such modifications, substitutions and alternatives can be made without departing from the spirit and scope of the invention, which should be determined from the appended claims.

Various features of the invention are set forth in the appended claims.

What is claimed is:

1. A GaN-based HFET comprising:
   a buffer layer;
   a channel layer;
   a bottom barrier layer disposed between the buffer layer and the channel layer, the bottom barrier layer being less than 500 Å thick and having a first face with a positive charge and having a second face with a negative charge such that a potential change occurs between the first and second faces thereby forming an electron barrier between the channel layer and the buffer layer;
   a top barrier layer disposed on the channel layer; and
   wherein the buffer layer, the bottom barrier layer, the channel layer and the top barrier layer have a common face polarity.

2. The GaN-based HFET of claim 1 wherein the common face polarity is Ga-face.

3. The GaN-based HFET of claim 1 wherein the common face polarity is N-face.

4. The GaN-based HFET of claim 1 wherein the buffer layer comprises Gallium Nitride, wherein the bottom barrier layer comprises Indium Gallium Nitride, wherein the channel layer comprises Gallium Nitride, and wherein the top barrier layer comprises Aluminum Gallium Nitride, and further wherein the common face polarity is Ga-face.

5. The GaN-based HFET of claim 1 wherein the top barrier layer comprises a representative Aluminum mol fraction of twenty percent, and wherein the bottom barrier layer comprises a representative Indium mol fraction of eight percent.

6. The GaN-based HFET of claim 1 wherein the buffer layer comprises Aluminum Gallium Nitride, wherein the bottom barrier layer comprises Gallium Nitride, wherein the channel layer comprises Aluminum Gallium Nitride, and wherein the top barrier layer comprises Aluminum Gallium Nitride, and further wherein the common face polarity is Ga-face.

7. The GaN-based HFET of claim 6 wherein the buffer layer and channel layer comprise a representative Aluminum mol fraction ranging from five percent to ten percent.

8. The GaN-based HFET of claim 6 wherein the top barrier layer comprises a representative Aluminum mol fraction of twenty four percent, and wherein the channel layer comprises a representative Aluminum mol fraction of eight percent and further wherein the buffer layer comprises a representative Aluminum mol fraction of eight percent.

9. The GaN-based HFET of claim 6 wherein the top barrier layer comprises a representative Aluminum mol fraction of eight percent; wherein the channel layer comprises a representative Aluminum mol fraction of eight percent, and wherein the buffer layer comprises a representative Aluminum mol fraction of eight percent.

10. The GaN-based HFET of claim 6 wherein the buffer layer further comprises GaN that grades into AlGaN and further wherein the buffer layer is doped with a dopant to compensate for buffer layer leakage.

11. The GaN-based HFET of claim 10 wherein the dopant comprises Be.

12. The GaN-based HFET of claim 1 wherein the buffer layer comprises Gallium Nitride, wherein the bottom barrier layer comprises Aluminum Gallium Nitride, wherein the channel layer comprises Gallium Nitride and wherein the top barrier layer comprises Indium Gallium Nitride and further wherein the face polarity is N-face.

13. The GaN-based HFET of claim 1 wherein the bottom barrier layer is less than 100 Å thick.

14. The GaN-based HFET of claim 1, wherein the bottom barrier layer is selected from one of InGaN and GaN having a thickness in the range of 75–100 Å.

15. An inverted GaN-based HFET comprising:
   a buffer layer;
   a channel layer;
   a barrier layer disposed between the buffer layer and the channel layer, the barrier layer being less than 500 Å thick and having a first face with a positive charge and having a second face with a negative charge such that a potential change occurs between the first and second faces thereby forming an electron barrier between the channel layer and the buffer layer; and,
   wherein the buffer layer, the barrier layer, and the channel layer have a common face polarity.

16. The GaN-based HFET of claim 15, wherein the bottom barrier layer is selected from one of InGaN and GaN having a thickness in the range of 75–100 Å.

17. The inverted GaN-based HFET of claim 15 wherein the common face polarity is Ga-face polarity.

18. The inverted GaN-based HFET of claim 15 wherein the common face polarity is N-face polarity.

19. The inverted GaN-based HFET of claim 15 wherein the buffer layer comprises GaN, wherein the barrier layer comprises InGaN, and wherein the channel layer comprises GaN, and further wherein the buffer layer, the barrier layer and the channel layer have a Ga-face polarity.

20. The inverted GaN-based HFET of claim 15 wherein the channel layer is doped with Silicon causing a concentration of electrons to form in the channel layer.

21. The inverted GaN-based HFET of claim 15 wherein the buffer layer and the barrier layer are doped with Silicon causing a concentration of electrons to form in the channel layer.

22. The inverted GaN-based HFET of claim 15 wherein the buffer layer comprises Aluminum Gallium Nitride, wherein the barrier layer comprises Gallium Nitride, and wherein the channel layer comprises Aluminum Gallium Nitride, and further wherein the buffer layer, the barrier layer and the channel layer have a Ga-face polarity.

23. The inverted GaN-based HFET of claim 15 wherein the buffer layer comprises Gallium Nitride, wherein the barrier layer comprises Aluminum Gallium Nitride, and wherein the channel layer comprises Gallium Nitride, and further wherein the buffer layer, the barrier layer and the channel layer have an N-face polarity.

* * * * *

UNITED STATES PATENT AND TRADEMARK OFFICE
CERTIFICATE OF CORRECTION

PATENT NO. : 6,624,452 B2
DATED : September 23, 2003
INVENTOR(S) : Yu et al.

It is certified that error appears in the above-identified patent and that said Letters Patent is hereby corrected as shown below:

Column 1,
Line 10, delete "+gi".

Column 2,
Line 66, delete "11".

Column 4,
Lines 32, 43 and 47, delete "baffler" and insert -- barrier --.

Signed and Sealed this

Eighteenth Day of May, 2004

JON W. DUDAS
*Acting Director of the United States Patent and Trademark Office*